United States Patent
Nishimura

(10) Patent No.: US 11,237,474 B2
(45) Date of Patent: Feb. 1, 2022

(54) PELLICLE AND METHOD FOR PRODUCING THE SAME

(71) Applicant: Shin-Etsu Chemical Co., Ltd., Tokyo (JP)

(72) Inventor: Akinori Nishimura, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 115 days.

(21) Appl. No.: 16/700,077

(22) Filed: Dec. 2, 2019

(65) Prior Publication Data

US 2020/0174360 A1 Jun. 4, 2020

(30) Foreign Application Priority Data

Dec. 3, 2018 (JP) ................ JP2018-226482

(51) Int. Cl.
*G03F 1/62* (2012.01)
(52) U.S. Cl.
CPC ..................... *G03F 1/62* (2013.01)
(58) Field of Classification Search
CPC ..................... G03F 1/62; G03F 1/64
USPC ........................................... 430/5
See application file for complete search history.

(56) References Cited

U.S. PATENT DOCUMENTS

| 9,436,080 B2 | 9/2016 | Beyer et al. |
| 10,061,192 B2 | 8/2018 | Beyer et al. |
| 2006/0234134 A1 | 10/2006 | Tregub et al. |
| 2008/0248406 A1 * | 10/2008 | Shirasaki .......... G03F 1/62 430/5 |
| 2018/0329289 A1 | 11/2018 | Gallagher et al. |

FOREIGN PATENT DOCUMENTS

| EP | 1978405 A1 | 10/2008 |
| EP | 3079014 A2 | 10/2016 |
| JP | 11-65092 A | 3/1999 |
| JP | 2008-276195 A | 11/2008 |
| JP | 5821100 B2 | 11/2015 |
| JP | 2018-508048 A | 3/2018 |
| WO | WO 2016/144690 A1 | 9/2016 |

OTHER PUBLICATIONS

Extended European Search Report, dated May 4, 2020, for European Application No. 19210261.4.
Japanese Office Action for Japanese Application No. 2018-226482, dated Oct. 19, 2021, with English translation.

* cited by examiner

*Primary Examiner* — Christopher G Young
(74) *Attorney, Agent, or Firm* — Birch, Stewart, Kolasch & Birch, LLP

(57) ABSTRACT

The present invention is to provide a pellicle characterized by including a pellicle film and a pellicle frame, in which the pellicle film is stretched on the pellicle frame, and the pellicle film is an annealed pellicle film, and to provide a method for producing a pellicle by stretching a pellicle film on a pellicle frame, including the step of annealing the pellicle film alone before stretching the pellicle film on the pellicle frame, annealing the pellicle after stretching the pellicle film on the pellicle frame, or annealing the pellicle film alone and the pellicle both before and after stretching the pellicle film on the pellicle frame.

15 Claims, No Drawings

PELLICLE AND METHOD FOR PRODUCING THE SAME

CROSS-REFERENCE TO RELATED APPLICATION

This non-provisional application claims priority under 35 U.S.C. § 119(a) on Patent Application No. 2018-226482 filed in Japan on Dec. 3, 2018, the entire contents of which are hereby incorporated by reference.

TECHNICAL FIELD

The present invention relates to a pellicle frame, and a pellicle for photolithography constituted by using the pellicle frame.

BACKGROUND ART

In a step of photolithography when a semiconductor device, a liquid crystal display, or the like is produced, a pattern is formed by irradiating a semiconductor wafer or an original plate for liquid crystal, to which a resist has been applied, with light, however, if foreign matters adhere to a photomask or reticle (hereinafter referred to as photomask) to be used at this time, the foreign matters absorb the light or bend the light, so that there has been a problem that the transferred pattern is deformed or the edge becomes coarse, further the base becomes black and dirty, and the dimension, the quality, the appearance, and the like are impaired.

The step of photolithography is usually performed in a clean room, however, it is still difficult to keep the exposure original plate clean at all times, and therefore, in general, a method in which a foreign matter guard called pellicle is arranged on the exposure original plate and exposure is performed on the plate is adopted.

Such a pellicle is generally constituted of a pellicle frame in a frame shape, a pellicle film stretched on an upper end face of the pellicle frame, an airtight gasket formed on a lower end face of the pellicle frame, and the like. The pellicle film in the pellicle is constituted of a material having a high transmittance to exposure light, and as the airtight gasket, a pressure-sensitive adhesive agent or the like is used.

If such a pellicle is arranged on a photomask, the foreign matters do not adhere directly onto the photomask but adhere onto the pellicle. Further, if the focal point is set on a pattern of the photomask in lithography, the foreign matters on the pellicle become irrelevant to the transfer, and a problem of deformation or the like of a pattern can be suppressed.

By the way, in such a photolithography technique, as a means for enhancing the resolution, the wavelength of an exposure light source has been shortened. To date, the exposing light source has shifted from a g-line (436 nm) or i-line (365 nm) by a mercury lamp to a KrF excimer laser (248 nm), and in recent years, an ArF excimer laser (193 nm) is most frequently used when fine processing is required.

In recent years, in order to perform finer processing by using an ArF excimer laser, an immersion exposure device is used. By filling the space between an objective lens of an exposure device and a silicon wafer with a liquid, a higher numerical aperture (NA) is realized, and as a result, a higher resolution is obtained. In this way, if an exposure device has a high NA, the angle of oblique incidence increases in a peripheral part in the light transmitted through a pellicle. The transmittance of a pellicle is generally set so that the maximum transmittance can be obtained with respect to the normal incident light, however, a phenomenon that the transmittance decreases as the incident angle increases is observed. The degree of decrease in the transmittance is more remarkable if the film thickness is thicker. For this reason, it is common to reduce the thickness of the pellicle film in order to obtain a high transmittance even for the oblique incident light.

By the way, if the pellicle film is thinned, there is a problem that the strength of the film is reduced along with the thinning of the film. At the time of exposure, a photomask unit prepared by attaching a pellicle onto a photomask substrate is operated in a scanning motion at high speed, and therefore, in a case where the strength of a pellicle film is small, the film tends to vibrate during the high-speed scanning operation. That is, it has been found that due to the vibration of the film, the exposure light is easily disturbed when passing through the pellicle film, a pattern is shifted from an originally intended position, and as a result of which the positional accuracy (overlay) of the pattern may be deteriorated.

In addition, as the conventional techniques relating to a process for improving the overlay, the following patent publication and the like can be mentioned.

CITATION LIST

Patent Document 1: JP-A 2018-508048
Patent Document 2: JP-B2 5821100

SUMMARY OF THE INVENTION

Accordingly, the present invention has been made to solve the problem described above, an object of the present invention is to provide a pellicle in which the strength of a pellicle film is improved, the vibration of the pellicle film due to high-speed scanning operation during exposure is reduced, and the deterioration of overlay can be suppressed.

As a result of the intensive studies by the present inventors on the above problems, it has been found that by subjecting a pellicle film to heat treatment (annealing treatment), the strength of the pellicle film is improved as compared with the case where the treatment has not been performed. As a result, the present inventors have found that excessive vibration of a pellicle film is reduced even during the high-speed scanning operation at the time of exposure, and therefore, the pattern can be transferred to the target position without disturbance in exposure light when the exposure light passes through the pellicle film, and the deterioration of overlay after the exposure can be suppressed, and thus have completed the present invention.

Therefore, the present invention is to provide the following pellicle and method for producing the pellicle.
1. A pellicle, including a pellicle film and a pellicle frame, the pellicle film being stretched on the pellicle frame, and the pellicle film being an annealed pellicle film.
2. The pellicle described in the above 1, wherein a film tension (film frequency) of the pellicle film stretched on the pellicle frame is 30 Hz or more.
3. A method for producing a pellicle by stretching a pellicle film on a pellicle frame, including the step of: annealing the pellicle film alone before stretching the pellicle film on the pellicle frame; annealing the pellicle after stretching the pellicle film on the pellicle frame; or annealing the pellicle film alone and the pellicle both before and after stretching the pellicle film on the pellicle frame.

Advantageous Effects of the Invention

According to the pellicle of the present invention, as compared with a conventional pellicle, by performing annealing treatment, the strength of a pellicle film is improved, and the vibration of the pellicle film due to high-speed scanning operation during exposure is reduced, and therefore, the pattern can be transferred to the target position without disturbance in exposure light when the exposure light passes through the pellicle film, and the deterioration of overlay after the exposure can be suppressed, and thus the pellicle of the present invention is effective in a fine pattern forming step.

DESCRIPTION OF THE PREFERRED EMBODIMENT

Hereinafter, one embodiment of the present invention is described in detail, however, the present invention is not limited to the embodiment.

The pellicle according to the present invention is particularly effective when applied to the use for producing a semiconductor in which distortion of a photomask particularly becomes a problem, however, the pellicle is not limited to the use. The pellicle according to the present invention can be applied to all of the pellicle, in which the distortion of a photomask due to the attachment of a pellicle becomes a problem, that is, for example, not only to the use for producing a semiconductor with sides of around 150 mm, but also to the use for producing a printed board with sides of 200 to 300 mm and to the use for producing an organic electroluminescence (EL) display with sides of nearly 500 to 2,000 mm.

Although not particularly shown, the pellicle according to the present invention is constituted to include a pellicle frame in a frame shape and a pellicle film stretched on an upper end face of the pellicle frame. As the material for the pellicle frame, a known material, for example, a metal or alloy such as an aluminum alloy, iron and steel, stainless steel, brass, invar, or super invar, an engineering plastic such as polyethylene (PE), polyamide (PA), or polyether ether ketone (PEEK), a fiber composite material such as glass fiber reinforced plastic (GFRP), or carbon fiber reinforced plastic (CFRP), or the like can be used.

In addition, it is preferred that the surface of the pellicle frame is treated to be colored in black, and further is subjected to a surface treatment such as painting for preventing dust generation as needed. For example, in a case where an aluminum alloy is used as the material for the pellicle frame, it is preferred to perform a surface treatment such as alumite treatment, or chemical conversion treatment, and in a case where iron and steel, stainless steel, or the like is used as the material for the pellicle frame, it is preferred to perform a surface treatment such as black chrome plating.

In order to capture or fix floating foreign matters, it is preferred to apply an adhesive substance such as an acrylic pressure-sensitive adhesive agent, or a silicone-based pressure-sensitive adhesive agent onto an inner surface of the pellicle frame. Further, it is preferred to form a film of a non-adhesive resin such as an acrylic resin, or a fluorine-based resin only on the inner surface or on the entire surface of the pellicle frame for the purpose of preventing dust generation. With respect to the formation of a film of such an adhesive resin or a non-adhesive resin, a known method such as spraying, dipping, powder coating, or electrodeposition coating can be applied for the formation.

In addition, multiple jig holes or grooves may be provided in multiple points on an outer surface of the pellicle frame for the application to handling, and it is preferred to display the model number, the serial number, the bar code, and the like by mechanical stamp marking or laser marking.

Further, the pellicle according to the present invention may be provided with a vent hole for adjusting the internal pressure, and a filter made of a porous thin film of polytetrafluoroethylene (PTFE) or the like may be attached to the outside of the pellicle in order to prevent the intrusion of foreign matters. At this time, the filter may be directly attached onto an outer surface of a pellicle frame by providing, for example, an adhesive layer made of an appropriate material. In addition, the arrangement position, the number, and the shape of the vent hole and filter can be appropriately determined in consideration of the required permeability, the handling convenience, and the like.

As the pellicle film used in the present invention, an optimal pellicle film is selected from a material such as a cellulosic resin, or a fluorine-based resin, corresponding to an exposure light source to be used, and from the viewpoint of the transmittance, the mechanical strength, or the like, a film thickness optimal for the pellicle film is selected from a range of around 0.1 to 10 µm, and further an anti-reflection layer may be applied to the pellicle film as needed. In particular, in a case where EUV light is used as the exposure light source, an ultrathin silicon film or graphene film having a thickness of 1 µm or less can be used. In addition, as the adhesive agent to use for stretching the pellicle film on an upper end face of the pellicle frame, a known adhesive agent such as an acrylic-based adhesive agent, a fluorine-based adhesive agent, or a silicone-based adhesive agent can be used.

The pressure-sensitive adhesive agent layer for attaching the pellicle according to the present invention to a photomask is provided on a lower end face of the pellicle frame. As the material for the pressure-sensitive adhesive agent layer, a known material such as a rubber-based pressure-sensitive adhesive agent, an urethane-based pressure-sensitive adhesive agent, an acrylic pressure-sensitive adhesive agent, a styrene ethylene butylene styrene (SEBS) pressure-sensitive adhesive agent, a styrene ethylene propylene styrene (SEPS) pressure-sensitive adhesive agent, or a silicone pressure-sensitive adhesive agent can be used. Further, a material having less generation of the outgas that causes haze is preferably used.

In order to ensure the stability after attaching the pellicle on a photomask and to reduce the influence on the photomask, the flatness on a surface of a pressure-sensitive adhesive agent layer is preferably 30 µm or less. In addition, the thickness of a cross-sectional shape may be selected as needed, and for example, the cross-sectional shape may be made into a semicircular convex shape.

On the surface of the pressure-sensitive adhesive agent layer, a separator obtained by imparting peelability onto a surface of a film made of PET, or the like and having a thickness of around 50 to 300 µm may be arranged. The separator is used for protecting the pressure-sensitive adhesive agent layer, and may be omitted by devising a pellicle case, or a pellicle support means, or the like.

In the present invention, by annealing a pellicle film alone before stretching the pellicle film on a pellicle frame, by annealing a pellicle in which a pellicle film has been stretched after stretching the pellicle film on a pellicle frame, or by annealing a pellicle film alone and a pellicle both before and after stretching the pellicle film on a pellicle frame, the strength of the pellicle film is improved and the deterioration of overlay can be effectively suppressed, as compared with the case where the annealing has not been performed.

The preset temperature of the annealing treatment (heat treatment) depends on the glass transition temperature (Tg) of a pellicle film (material) to be used. In general, most of the pellicle films are amorphous, and it is considered that if the temperature is a temperature of the glass transition temperature (Tg) or more, a disadvantageous effect is exerted, for example, the film is wrinkled or broken, and the tension is decreased. Therefore, the optimal temperature for the annealing treatment is suitably −5 to −50° C., and more preferably −10 to −30° C. of the Tg of the pellicle film to be used. However, it is considered that the film tension does not decrease unless the temperature in the annealing treatment exceeds the Tg described above, and therefore, it is considered that there is no significant quality problem even at a temperature lower than the above temperature. The set time for the annealing treatment (heat treatment) is preferably 1 to 48 hours, and more preferably 1 to for 24 hours. If the set time is longer than the above set time, although the film tension hardly changes, the working efficiency may be decreased. In addition, as the device for the annealing treatment, a commercially available device can be used, and for example, "Clean Oven DE610U" (product name) that is an instrument manufactured by Yamato Scientific Co., Ltd., or the like can be mentioned.

Further, in the present invention, a film tension (film frequency) of the pellicle film stretched on the pellicle frame is preferably 30 Hz or more. If the film tension of the pellicle film is less than 30 Hz, the overlay becomes larger than 1 nm, and the pattern positional accuracy is deteriorated. The frequency of the pellicle film can be measured by, for example, "PERSONAL FFT ANALYZER: CF-4210Z" manufactured by ONO SOKKI CO., LTD, or the like.

In the present invention, patterning is performed in a state that a photomask unit prepared by attaching a pellicle onto a photomask substrate is operated in a scanning motion at high speed, and the overlay accuracy is evaluated by the positional displacement in the X direction and Y direction from the target position. The smaller the positional displacement in both directions is, the better the overlay accuracy is. In the next-generation semiconductor device or liquid crystal display, extremely fine pattern formation is required, and the positional accuracy of overlay is preferably 1 nm or less. In the measurement of the positional displacement in the X direction and Y direction from the target position of patterning, for example, the positional displacement can be measured by using a wafer measuring machine, "YIELD-STAR T-250D" manufactured by ASML Holding N.V., or the like.

EXAMPLES

Hereinafter, the present invention is specifically described by referring to Examples and Comparative Examples, however, the present invention is not limited at all by the following Examples.

Example 1

In Example 1, at first, a pellicle frame (having an external size of 149 mm×115 mm×3.15 mm) made of an aluminum alloy was prepared. Further, a filter hole having a diameter of 10 mm is provided in a central part of a short side of the pellicle frame.

Next, the prepared pellicle frame was washed with pure water, and then a CYTOP adhesive agent (trade name: CTX-A) manufactured by ASAHI GLASS CO., LTD. was applied onto an upper end face of the pellicle frame, and an acrylic pressure-sensitive adhesive agent (SK-DYNE 1495S manufactured by Soken Chemical & Engineering Co., Ltd.) was applied onto a lower end face of the pellicle frame. After that, the pellicle frame was heated up to 130° C. to cure the adhesive agent, and the pressure-sensitive adhesive agent.

Subsequently, a pellicle film having a thickness of 0.28 μm made of CYTOP (trade name: CTX-S) manufactured by ASAHI GLASS CO., LTD., which had been attached to an aluminum frame having a size larger than the size of the pellicle frame was attached on the adhesive agent layer side of the pellicle frame, a part on the outer side of the pellicle frame was removed, and a pellicle was completed. In this regard, the Tg of CYTOP (trade name: CTX-S) manufactured by ASAHI GLASS CO., LTD., was 108° C.

The prepared pellicle was subjected to annealing treatment so that the frequency of the pellicle film was 26 Hz. Specifically, the annealing treatment was performed at a preset temperature of 50° C. for a treatment time of one hour.

In this regard, the frequency of the pellicle film was measured by PERSONAL FFT ANALYZER: CF-4210Z manufactured by ONO SOKKI CO., LTD. In the measurement method, the pellicle film was vibrated by applying a constant impact to the pellicle, the frequency was detected by an ordinary sound level meter manufactured by ONO SOKKI CO., LTD., and the numerical value displayed on PERSONAL FFT ANALYZER: CF-4210Z was used as the frequency of the film. The film frequency of the pellicle film was measured, and then when the pellicle was attached onto a photomask substrate having a 150 mm square, and the overlay accuracy was evaluated, the overlay was 1.34 nm. In this regard, the conditions for attaching the pellicle to the photomask were set to a load of 5 kgf and a load time of 30 seconds.

Example 2

In Example 2, a pellicle was prepared in a similar manner as in Example 1 except that the annealing treatment was performed under the conditions of a preset temperature of 70° C. and a treatment time of one hour so that the film frequency of the pellicle film was 28 Hz. At this time, the overlay was 1.07 nm.

Example 3

In Example 3, a pellicle was prepared in a similar manner as in Example 1 except that the annealing treatment was performed under the conditions of a preset temperature of 90° C. and a treatment time of one hour so that the film frequency of the pellicle film was 30 Hz. At this time, the overlay was 0.81 nm.

Example 4

In Example 4, a pellicle was prepared in a similar manner as in Example 1 except that the annealing treatment was performed under the conditions of a preset temperature of 90° C. and a treatment time of 12 hours so that the film frequency of the pellicle film was 32 Hz. At this time, the overlay was 0.51 nm.

Example 5

In Example 5, a pellicle was prepared in a similar manner as in Example 1 except that the annealing treatment was performed under the conditions of a preset temperature of 90° C. and a treatment time of 48 hours so that the film frequency of the pellicle film was 33 Hz. At this time, the overlay was 0.50 nm.

Comparative Example 1

Comparative Example 1 is a case of a pellicle in which annealing treatment was not performed. A pellicle was prepared in a similar manner as in Example 1 except that the annealing treatment was not performed. At this time, the film frequency of the pellicle film was 24 Hz, and the overlay was 1.54 nm.

Comparative Example 2

Comparative Example 2 is a case of having a preset temperature of 108° C. in the annealing treatment. A pellicle was prepared in a similar manner as in Example 1 except that the annealing treatment was performed under the conditions of a preset temperature of 108° C. and a treatment time of one hour. At this time, the film frequency of the pellicle film was 15 Hz, and the overlay was 2.83 nm.

TABLE 1

|   | Film tension (film frequency) (Hz) | Overlay (nm) | Evaluation |
| --- | --- | --- | --- |
| Example 1 | 26 | 1.34 | Δ |
| Example 2 | 28 | 1.07 | Δ |
| Example 3 | 30 | 0.81 | ○ |
| Example 4 | 32 | 0.51 | ○ |
| Example 5 | 33 | 0.50 | ○ |
| Comparative Example 1 | 24 | 1.54 | X |
| Comparative Example 2 | 15 | 283 | X |

Japanese Patent Application No. 2018-226482 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pellicle, comprising a pellicle film and a pellicle frame, the pellicle film being stretched on the pellicle frame, wherein a film tension (film frequency) of the pellicle film stretched on the pellicle frame is 32 Hz or more.

2. The pellicle according to claim 1, wherein the film tension (film frequency) of the pellicle film is from 32 to 33 Hz.

3. The pellicle according to claim 1, wherein the pellicle film is an annealed pellicle film and a temperature for an annealing treatment is from −30 to −10° C. of a glass transition temperature (Tg) of the pellicle film.

4. The pellicle according to claim 1, wherein the pellicle film is amorphous.

5. The pellicle according to claim 1, wherein the pellicle film is made of a cellulosic resin or a fluorine-based resin.

6. The pellicle according to claim 1, wherein, a positional accuracy is 1 nm or less, when patterning is performed in a state that a photomask unit prepared by attaching the pellicle onto a photomask substrate is operated in a scanning motion at high speed and an overlay accuracy is evaluated by a positional displacement in a X direction and Y direction from a target position.

7. A photomask attaching a pellicle, wherein the pellicle of claim 1 is attached onto a surface of a photomask.

8. An exposure method, wherein an exposure is performed by using the photomask attaching the pellicle of claim 7.

9. The exposure method of claim 8, wherein the exposure is performed with an immersion exposure device by using an ArF excimer laser.

10. A manufacturing method of a semiconductor device, comprising a step of performing an exposure by using the photomask attaching a pellicle of claim 7.

11. The manufacturing method of claim 10, wherein the exposure is performed with an immersion exposure device by using an ArF excimer laser.

12. A manufacturing method of a liquid crystal display, comprising a step of performing an exposure by using the photomask attaching a pellicle of claim 7.

13. The manufacturing method of claim 12, wherein the exposure is performed with an immersion exposure device by using an ArF excimer laser.

14. A manufacturing method of an organic electroluminescence (EL) display, comprising a step of performing an exposure by using the photomask attaching a pellicle of claim 7.

15. The manufacturing method of claim 14, wherein the exposure is performed with an immersion exposure device by using an ArF excimer laser.

* * * * *